(12) United States Patent
Laskowsky et al.

(10) Patent No.: US 9,130,248 B2
(45) Date of Patent: Sep. 8, 2015

(54) MODELING CHANGES IN THE STATE-OF-CHARGE OPEN CIRCUIT VOLTAGE CURVE BY USING REGRESSED PARAMETERS IN A REDUCED ORDER PHYSICS BASED MODEL

(75) Inventors: Patricia M. Laskowsky, Ann Arbor, MI (US); Brian J. Koch, Berkley, MI (US); Damon R. Frisch, Troy, MI (US); Ramesh Rebba, Rochester Hills, MI (US); Kurt M. Johnson, Brighton, MI (US)

(73) Assignee: GM Global Technology Operations LLC, Detroit, MI (US)

(*) Notice: Subject to any disclaimer, the term of this patent is extended or adjusted under 35 U.S.C. 154(b) by 608 days.

(21) Appl. No.: 13/481,290

(22) Filed: May 25, 2012

(65) Prior Publication Data

US 2013/0317771 A1 Nov. 28, 2013

(51) Int. Cl.
*H01M 10/48* (2006.01)
*B60L 11/18* (2006.01)
*G01R 31/36* (2006.01)
*H01M 10/0525* (2010.01)

(52) U.S. Cl.
CPC ......... *H01M 10/482* (2013.01); *B60L 11/1857* (2013.01); *B60L 11/1861* (2013.01); *B60L 11/1864* (2013.01); *G01R 31/3675* (2013.01); *B60L 2240/547* (2013.01); *B60L 2240/549* (2013.01); *G01R 31/3651* (2013.01); *H01M 10/0525* (2013.01); *H01M 2220/20* (2013.01); *Y02T 10/7005* (2013.01); *Y02T 10/7011* (2013.01); *Y02T 10/7044* (2013.01); *Y02T 10/7061* (2013.01)

(58) Field of Classification Search
CPC ............ G01R 31/3651; H01M 10/482; Y02T 10/7044
USPC ....................... 702/63; 324/425–434; 320/132
See application file for complete search history.

(56) References Cited

U.S. PATENT DOCUMENTS

2011/0086286 A1* 4/2011 Ganapathy et al. ........... 429/432

OTHER PUBLICATIONS

Speltino Carmelo, (Experimental Validation of a Lithium-Ion Battery State of Charge Estimation with an Extended Kalman Filter) Part i. In the European Control Conference, 2009.
Zhang Qi, (Capacity fade analysis of a lithium ion cell) Journal of Power Sources 179 (2008) pp. 793-798.

(Continued)

*Primary Examiner* — John Breene
*Assistant Examiner* — Manuel Rivera Vargas
(74) *Attorney, Agent, or Firm* — John A. Miller; Miller IP Group, PLC

(57) ABSTRACT

A method for modeling changes in the state of charge vs. open circuit voltage (SOC-OCV) curve for a lithium-ion battery cell as it ages. During battery pack charging, voltage and current data are gathered for a battery cell. A set of state equations are used to determine the stoichiometry and state of charge of the cathode half-cell based on the charging current profile over time. The voltage and current data, along with the stoichiometry and state of charge of the cathode half-cell, are then used to estimate maximum and minimum solid concentration values at the anode, using an error function parameter regression/optimization. With stoichiometric conditions at both the cathode and anode calculated, the cell's capacity and a new SOC-OCV curve can be determined.

20 Claims, 3 Drawing Sheets

(56) References Cited

OTHER PUBLICATIONS

Di Domenico Domenico, (Lithium-Ion battery State of Charge Estimation with Kalman Filter based on a electrochemical model) In Proc. IEEE International Conference on Control applications CCA, Sep. 2008, pp. 702-707.

Newman John, (Porous-Electrode Theory with Battery Applications) AIChE Journal, 1975 (vol. 21, No. 1) pp. 25-41.

* cited by examiner

MODELING CHANGES IN THE STATE-OF-CHARGE OPEN CIRCUIT VOLTAGE CURVE BY USING REGRESSED PARAMETERS IN A REDUCED ORDER PHYSICS BASED MODEL

BACKGROUND OF THE INVENTION

1. Field of the Invention

This invention relates generally to state of charge determination of cells in a battery pack and, more particularly, to a method for modeling changes in the state of charge vs. open circuit voltage curve for battery cells as the cells age, where the curve is modeled using parameter regression or optimization in a physics-based model, and the resulting cell performance curve is used to improve state of charge determination and capacity estimation.

2. Discussion of the Related Art

Electric vehicles and gasoline-electric or diesel-electric hybrid vehicles are rapidly gaining popularity in today's automotive marketplace. Electric and hybrid-electric vehicles offer several desirable features, such as reducing or eliminating emissions and petroleum-based fuel consumption at the consumer level, and potentially lower operating costs. A key subsystem of electric and hybrid-electric vehicles is the battery pack, which can represent a substantial proportion of the vehicle's cost. Battery packs in these vehicles typically consist of numerous interconnected cells, which are able to deliver a lot of power on demand. Maximizing battery pack performance and life are key considerations in the design and operation of electric and hybrid electric vehicles.

A typical electric vehicle battery pack includes two or more battery pack sections, with each section containing many individual battery cells as needed to provide the required voltage and capacity. In order to optimize the performance and durability of the battery pack, it is important to monitor the state of charge of the cells. State of charge of a cell is typically determined based on the open circuit voltage of the cell, using a known relationship which is defined in the form of a state of charge vs. open circuit voltage (SOC-OCV) curve. However, as battery cells age, experiencing repeated charge-discharge cycles, the relationship between open circuit voltage and state of charge changes. While it is possible to disregard the change in state of charge as a function of open circuit voltage in aging battery cells, for example by using a conservatively low estimate of state of charge during vehicle operation, it is far preferable to accurately determine state of charge of battery cells even as they age. The accurate determination of state of charge as a function of open circuit voltage is important both during charging of the battery pack and during discharging as the vehicle is driven.

Various methods of characterizing performance changes in aging battery cells are known in the art. Many of these methods are empirically-based; that is, they predict changes in the battery cell's performance based on the number of charge-discharge cycles, using data from experimental measurements. Others of these methods simply estimate capacity fade, or reduction in energy storage capacity over time, but do not attempt to characterize the changes in the SOC-OCV curve. However, none of the known methods uses in-vehicle measurements and a physics-based model to determine the actual physical state of the battery pack's cells, including the SOC-OCV curve, as the battery pack ages.

SUMMARY OF THE INVENTION

In accordance with the teachings of the present invention, a method is disclosed for modeling changes in the state of charge vs. open circuit voltage (SOC-OCV) curve for a lithium-ion battery cell as it ages. During battery pack charging, voltage and current data are gathered for a battery cell. A set of state equations are used to determine the stoichiometry and state of charge of the cathode half-cell based on the charging current profile over time. The voltage and current data, along with the stoichiometry and state of charge of the cathode half-cell, are then used to estimate maximum and minimum stoichiometric solid concentration values for the anode by minimizing the error of a cost function. With stoichiometric conditions at both the cathode and anode calculated, the cell's capacity and a new SOC-OCV curve can be determined.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a method for modeling changes in the state of charge vs. open circuit voltage curve for a battery cell as it ages is merely exemplary in nature, and is in no way intended to limit the invention or its applications or uses. For example, the discussion that follows is directed to battery cells used in electric vehicle battery packs, but the method is equally applicable to battery cells in other vehicular and non-vehicular applications.

Battery packs in electric vehicles and gasoline-electric or diesel-electric hybrid vehicles (hereinafter collectively referred to simply as "electric vehicles") typically consist of hundreds of individual cells. In one popular lithium-ion rechargeable battery chemistry, each cell produces approximately 3.7 volts nominally, with the exact value depending on state of charge and other factors. Many cells connected serially in a module provide the high voltage necessary to drive electric vehicle motors, while multiple cells can be arranged in parallel in cell groups to increase capacity.

In order to manage the charging and discharging of an electric vehicle battery pack, it is important to know the state of charge of the battery cells at all times. State of charge is a number, expressed as a percentage, which indicates how much electrical energy is stored in a battery cell relative to the capacity of the cell. That is, a fully charged battery cell has a state of charge of 100%, while a fully discharged cell has a state of charge of 0%.

State of charge of a cell is typically determined based on the open circuit voltage of the cell, using a known relationship which is defined in the form of a state of charge vs. open circuit voltage (SOC-OCV) curve. Using this relationship, a battery supervisory controller in an electric vehicle can monitor the state of charge of the cells in a battery pack, and hence the state of charge of the overall battery pack, at all times.

However, as battery cells age, experiencing repeated charge-discharge cycles, the energy storage capacity fades to due loss of active material in the electrodes and an increase in internal resistance. The shape of the SOC-OCV curve also changes as a cell ages.

Figure 1:
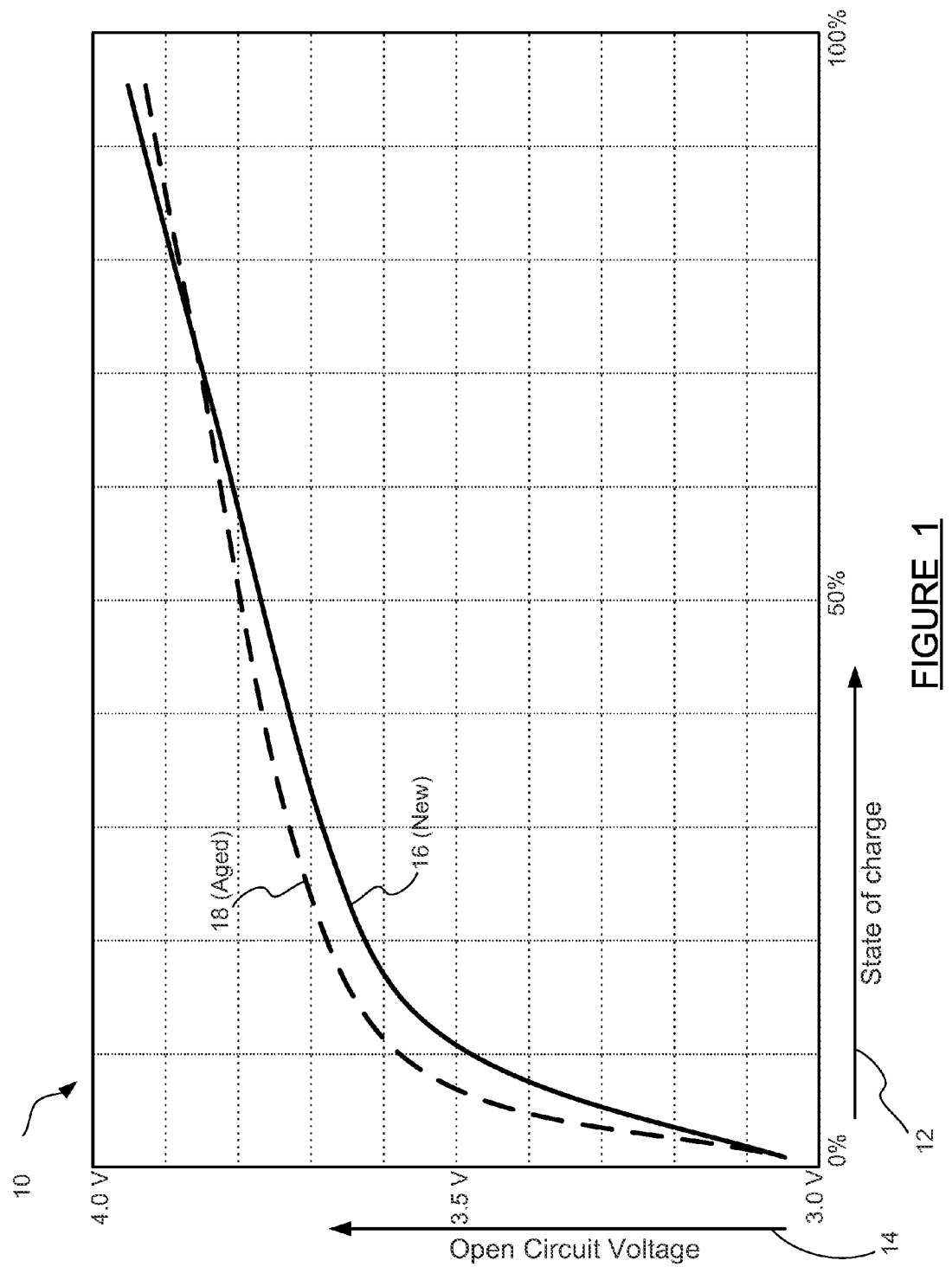
FIG. 1 is a graph showing state of charge vs. open circuit voltage (SOC-OCV) curves for a battery cell in both a new condition and an aged condition.

FIG. 1 is a graph 10 showing SOC-OCV curves for a battery cell in both a new condition and an aged condition. Horizontal axis 12 represents state of charge of the battery cell, ranging from 0-100%. Vertical axis 14 represents open circuit voltage of the cell, with values ranging from about 3.0 volts to about 4.0 volts. While the exact shape and scale of SOC-OCV curves vary based on battery chemistry, FIG. 1 is representative of a typical Lithium-ion battery cell. Curve 16 depicts the SOC-OCV curve for a battery cell when it is new. Curve 18 depicts the SOC-OCV curve for the same battery cell after it has aged, for example, by experiencing a life-time of charge-discharge cycles typical of an electric vehicle battery. It can be seen that a state of charge determined based on open circuit voltage from the curve 18 may be significantly different from the state of charge determined from the curve 16, especially in the 10-60% state of charge range. Thus, it is important to understand the changes in the SOC-OCV curve as a battery cell ages, in order to properly manage both charging and discharging operations.

At small currents, the effects of internal resistance are negligible and the shift in the cell's SOC-OCV curve can be isolated to the effects of the loss of active material. Furthermore, the loss of active material can be modeled with a reduced-order physics-based model through the use of stoichiometric concentrations. The stoichiometry, or solid concentrations at the electrode's electrolyte-solid boundary, is used to shift and scale the anode's half-cell SOC-OCV curve until it matches actual voltage and current data from a charging event. The resulting models of both the cathode's and the anode's half-cell stoichiometry enable the overall cell's adjusted SOC-OCV curve and capacity to be determined. Adjustment to the SOC-OCV curve can improve state of charge accuracy and therefore improve battery pack capacity estimates. In addition, by modeling the shift through physical parameters, a new diagnostic can be used for the state of health of the battery system.

Figure 2:
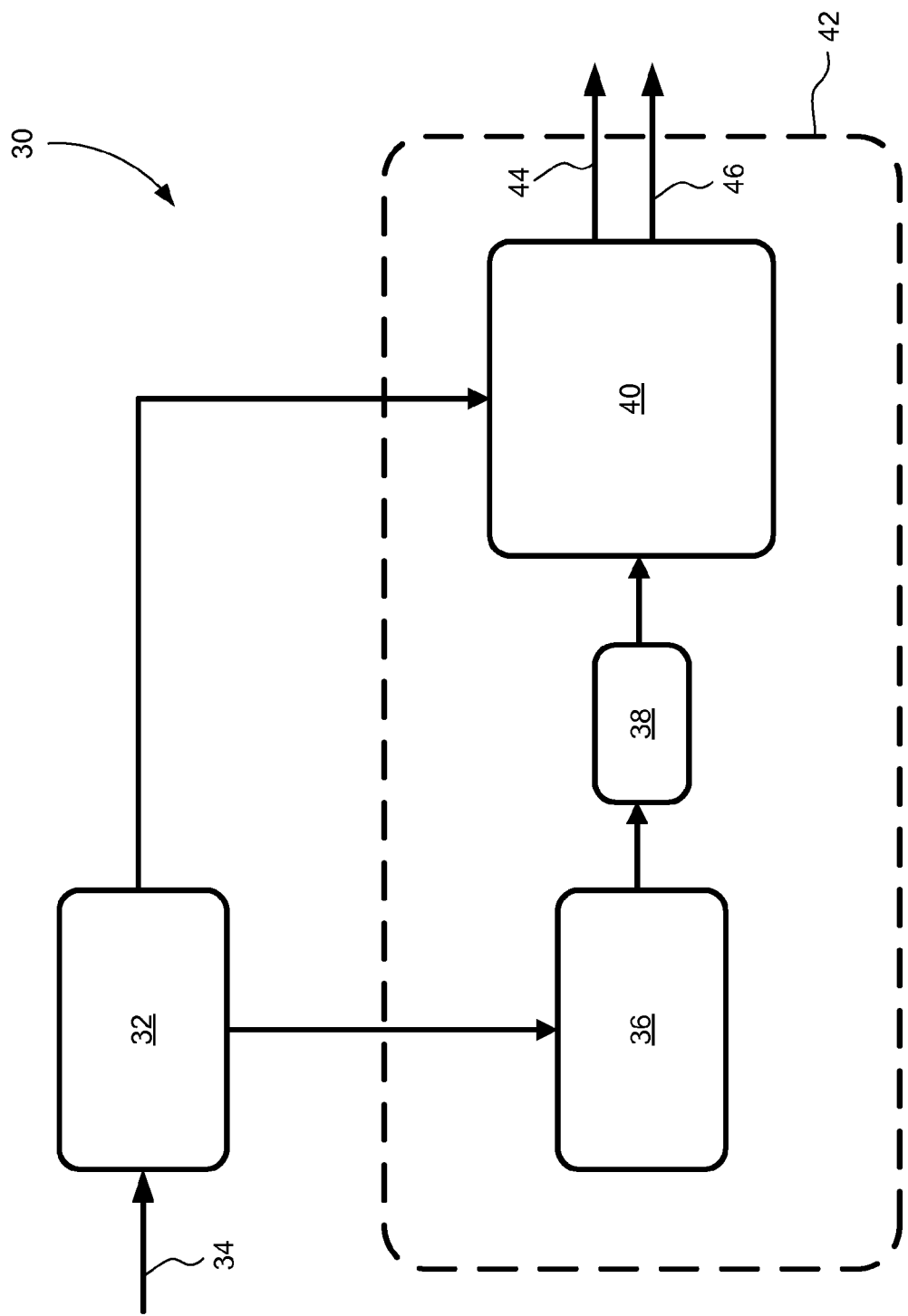
FIG. 2 is a block diagram of a system for determining an updated SOC-OCV curve and capacity for a battery cell as it ages.

FIG. 2 is a block diagram of a system 30 for determining a new SOC-OCV curve and capacity for a battery cell as it ages. A battery state estimator 32 monitors conditions in a battery pack, including charging and discharging current, and cell open circuit voltage. During a plug-in charge event, the battery state estimator 32 detects charging current to the battery pack on line 34, and stores charging current and open circuit voltage data as a function of time throughout the charging event. The current data and terminal voltage are provided to the battery state estimator 32 by sensors in the battery pack (not shown), and the open circuit voltage data are estimated by the battery state estimator 32, for each cell in the battery pack which is to be monitored.

It is to be noted that the data collection and calculations depicted in FIG. 2 may also be carried out during a discharging, or vehicle driving, event. However, for the sake of clarity and simplicity, the remainder of the discussion will be directed to a plug-in charge event.

Current data from the battery state estimator 32 is provided to a cathode concentration model 36. The cathode concentration model 36 uses a set of state-based equations to model the state of the cathode half-cell, as will be discussed further below. The cathode concentration model 36 outputs the cathode concentration, or the solid concentration of active material at the cathode, at box 38. The cathode concentration model 36 also outputs the cathode half-cell open circuit voltage corresponding to the cathode concentration, also at the box 38. The cathode concentration and half-cell voltage data are output as a function of time for the entire plug-in charge event.

A stoichiometry estimator 40 receives the cathode concentration and half-cell voltage data from the box 38 and the full-cell open circuit voltage data from the battery state estimator 32, and performs a parameter regression/optimization on the anode's solid concentrations until a convergence is achieved between the full-cell plug-in charge voltage data and the voltage data from the cathode and anode stoichiometric calculations. The cathode concentration model 36, the cathode data at the box 38, and the stoichiometry estimator 40 collectively make up a reduced-order physics-based model 42, the output of which is an updated SOC-OCV curve for the cell on line 44 and an updated capacity value for the cell on line 46. Calculations performed in the reduced-order physics-based model 42 will be discussed in detail below.

It is to be understood that the calculations performed in the reduced-order physics-based model 42 are preferably carried out on a microprocessor or computing device of some sort, as opposed to on a sheet of paper or in a person's head. Furthermore, the computing device which is configured to run the reduced-order physics-based model 42, along with the battery state estimator 32, may be onboard an electric vehicle which uses the battery cells being monitored.

Figure 3:
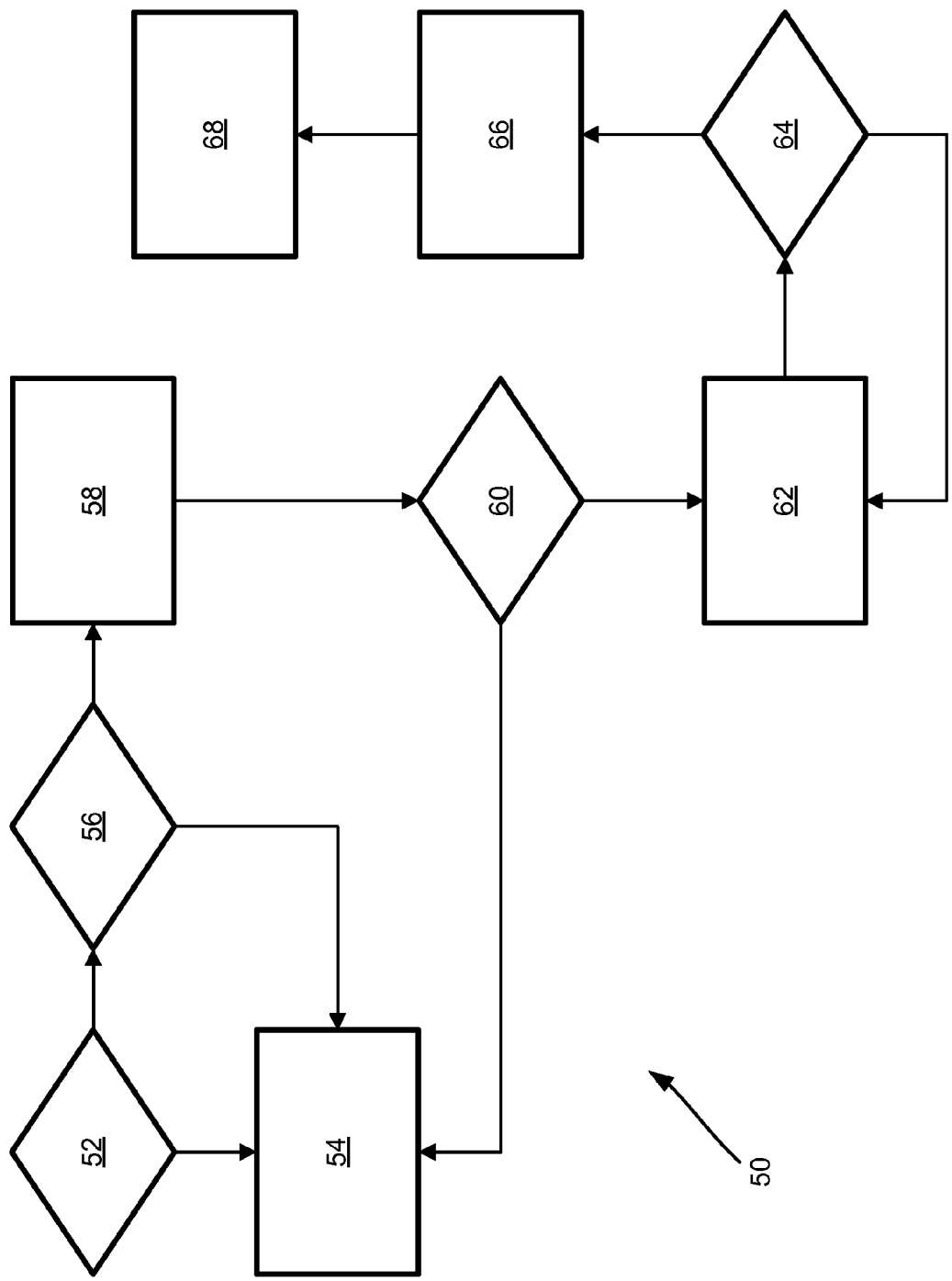
FIG. 3 is a flowchart diagram of a method for determining an updated SOC-OCV curve and capacity for a battery cell as it ages.

FIG. 3 is a flowchart diagram 50 of a method for determining a new SOC-OCV curve and capacity for a battery cell in an electric vehicle battery pack as it ages. The flowchart diagram 50 shows when and how the reduced-order physics-based model 42 is used to calculate the updated SOC-OCV curve and capacity. At decision diamond 52, a determination is made as to whether a plug-in charge event has been initiated. If no plug-in charge event is detected, no calculations are performed and the process ends at box 54. If a plug-in charge event is detected, at decision diamond 56 a determination is made as to whether the battery pack has been in service long enough to result in an appreciable change in the battery pack's performance characteristics. In one non-limiting example, a check could be performed to determine whether a capacity fade of 5% from new would be expected. This check could be based on nominal lab-test data, where a certain number of charge-discharge cycles results in a battery pack aging which exceeds the designated threshold. If the battery pack is so new that no appreciable aging has been experienced, no calculations are performed and the process ends at the box 54.

If, at the decision diamond 56, the battery pack is determined to have experienced appreciable aging, data are collected at box 58. The data collected at box 58 include the open circuit voltage of the cell as a function of time, the charging current as a function of time, and the rested minimum (beginning) and maximum (ending) open circuit voltage of the cell. Of course, this data can be collected, and the subsequent calculations performed, for many cells in the battery pack—but the discussion here is directed to the data collection and calculations for a single battery cell. The data collection at the box 58 continues for the duration of the plug-in charge event. At decision diamond 60, when the plug-in charge event is completed, a determination is made as to whether the state of charge differential from the beginning of the charge event to the end is large enough to facilitate running the calculations of battery cell performance. That is, if the plug-in charge event is terminated after a few minutes, and the state of charge of the cell does not change significantly, then there is no benefit in running the calculations, and the process ends at the box 54.

If a significant state of charge swing is detected at the decision diamond 60, then the reduced-order physics-based model 42 is run at box 62. As mentioned above and discussed below, the reduced-order physics-based model 42 includes a parameter regression/optimization technique which is iterative in nature. At decision diamond 64, a determination is made as to whether minimization of an error function has been achieved. If the error function has not been minimized, the process loops back to continue running the reduced-order physics-based model at the box 62. When error function minimization has been achieved as determined at the decision diamond 64, the process continues to box 66 where an updated cell capacity is calculated. Finally, a new SOC-OCV curve for the cell is calculated at box 68.

Following is a discussion of the calculations performed in the reduced-order physics-based model 42 described above. When reduced to first principles, the open circuit voltage of a full battery cell can be expressed as:

$$V_{oc} = U_p(soc_p) - U_n(soc_n) \tag{1}$$

Where $V_{oc}$ is the open circuit voltage of the full battery cell, $U_p(soc_p)$ is the open circuit voltage potential of the cathode half-cell at a particular state of charge (denoted by p for positive electrode), and $U_n(soc_n)$ is the open circuit voltage potential of the anode half-cell at a particular state of charge (denoted by n for negative electrode).

Equation (1) can be rewritten in the following form, where the state of charge is represented by the normalized solid concentration $\theta$ at both the cathode and the anode:

$$V_{oc} = U_p(\theta_p) - U_n(\theta_n) \tag{2}$$

Equation (2) can be further rewritten, replacing the normalized solid concentrations $\theta_p$ and $\theta_n$ as follows:

$$V_{oc} = U_p\left(\frac{c_{se,p}}{c_{s,max,p}}\right) - U_n\left(\frac{c_{se,n}}{c_{s,max,n}}\right) \tag{3}$$

Where $c_{se,p}$ is the solid concentration of active material at the solid-electrolyte interface at the cathode, $c_{s,max,p}$ is the maximum possible solid concentration of active material at the cathode, which is a known constant, $c_{se,n}$ is the solid concentration of active material at the solid-electrolyte interface at the anode, and $c_{s,max,n}$ is the maximum possible solid concentration of active material at the anode, which is also a known constant.

The negative concentration $c_{se,n}$ can then be estimated in terms of the positive concentration as follows:

$$c_{se,n} = c_{s,max,n} \cdot \left(\theta_{n0\%} + \frac{c_{se,p} - \theta_{p0\%} \cdot c_{s,max,p}}{(\theta_{p100\%} - \theta_{p0\%}) \cdot c_{s,max,p}}(\theta_{n100\%} - \theta_{n0\%})\right) \tag{4}$$

Where the various concentrations are as defined above, $\theta_{n0\%}$ is the minimum normalized solid concentration at the anode, $\theta_{n100\%}$ is the maximum normalized solid concentration at the anode, $\theta_{p0\%}$ is the minimum normalized solid concentration at the cathode, and $\theta_{p100\%}$ is the maximum normalized solid concentration at the cathode.

The maximum and minimum stoichiometric concentrations at the cathode ($\theta_{p100\%}$ and $\theta_{p0\%}$) do not vary much with cell aging. Therefore, equation (4) can be re-written in the following approximate form:

$$c_{se,n} = c_{s,max,n} \cdot (\theta_{n0\%} + \beta_p(\theta_{n100\%} - \theta_{n0\%})) \tag{5}$$

Where $\beta_p$ is a translation for the cathode's chemistry to the anode's chemistry.

Substituting from equation (5) into equation (1) yields:

$$V_{oc} = U_p(soc_p) - U_n(\theta_{n0\%} + \beta_p(\theta_{n100\%} - \theta_{n0\%})) \tag{6}$$

Because the maximum and minimum stoichiometric concentrations at the cathode ($\theta_{p100\%}$ and $\theta_{p0\%}$) do not vary much with cell aging, the cathode's half-cell open circuit voltage, concentration $c_{se,p}$, and state of charge $soc_p$ can be calculated given a time-based charging current profile, as described previously for the cathode concentration model 36. Then, using the full-cell open circuit voltage information from the battery state estimator 32 and the calculated cathode concentrations, the maximum and minimum stoichiometric concentrations can be estimated for the anode using the following error function minimization, for example in a parameter regression/optimization:

$$J = \min(V_{ocPIC}|_{V_{min}}^{V_{max}} - V_{ocMODEL}|_{V_{min}}^{V_{max}} f(\theta_{n\phi\%}, \theta_{n0\%})) \tag{7}$$

Where J is the function being minimized, $V_{ocPIC}|_{V_{min}}^{V_{max}}$ is the full-cell open circuit voltage data from the plug-in charge event over the full range of voltages, and $V_{ocMODEL}|_{V_{min}}^{V_{max}}$ is the full-cell open circuit voltage data from the reduced-order physics-based model 42, specifically equation (6), over the full range of voltages. As noted in equation (7), the full-cell open circuit voltage data from the model 42 is a function of the unknowns $\theta_{n100\%}$ and $\theta_{n0\%}$, the values of which are regressed/optimized until the error function is minimized.

In the regression/optimization calculation described above, the minimum and maximum voltages are defined as the starting and ending open circuit voltages for the plug-in charge event. The time between the minimum and maximum voltages and the profile of the open circuit voltage from the plug-in charge is also stored. The physics-based model 42 is run with different maximum and minimum stoichiometry points for the anode's reaction ($\theta_{n100\%}$ and $\theta_{n0\%}$), modeling a reduction of active material and producing different open circuit voltage profiles. The physics-based model 42 is run from a fully charged to a fully depleted battery defining the whole open circuit voltage profile. The open circuit voltage profiles are compared between the minimum and maximum voltage set by the plug-in charge for a given amount of time until the error function is minimized.

Once the maximum and minimum stoichiometric concentrations are determined as described above, the cell's updated SOC-OCV curve can be calculated from equation (6), and the cell's capacity can be calculated as follows:

$$Q = \int_{V_{min}}^{V_{max}} \left(\frac{I}{3600 \cdot (soc_{max}|V_{max} - soc_{min}|V_{min})}\right) dt \tag{8}$$

Where Q is the cell capacity, I is the time-based charging current from the plug-in charge event, and $soc_{max}|V_{max} - soc_{min}|V_{min}$ is the difference in state of charge between the maximum and minimum open circuit voltages.

Using the method disclosed herein, the actual performance of a battery cell, in the form of its SOC-OCV curve, can be monitored as the cell ages. Knowledge of the SOC-OCV curve for cells in a battery pack enables better management of battery pack charging and discharging, which leads to improved battery pack performance and durability.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for monitoring performance changes in aging cells in a battery pack, said method comprising:
   providing full-cell open circuit voltage data vs. time and current data vs. time for a cell in the battery pack, where the data is obtained by sensors during a plug-in charge event;
   calculating cathode half-cell stoichiometry using the current data and providing cathode concentration data vs. time and cathode half-cell open circuit voltage data vs. time;
   determining anode half-cell stoichiometry using the cathode concentration data, the cathode half-cell open circuit voltage data and the full-cell open circuit voltage data; and
   calculating, using a microprocessor, an updated state of charge vs. open circuit voltage curve (SOC-OCV curve) for the cell based on the cathode half-cell stoichiometry, the anode half-cell stoichiometry and a full-cell capacity.

2. The method of claim 1 wherein determining anode half-cell stoichiometry includes determining anode half-cell open circuit voltage based on estimated values for maximum and minimum normalized solid concentration at the anode.

3. The method of claim 2 wherein parameter regression/optimization is performed on the maximum and minimum normalized solid concentration values to achieve minimization of an error function comparing the full-cell open circuit voltage data from the plug-in charge event with calculated voltage data from the reduced-order physics-based model.

4. The method of claim 3 wherein comparing the full-cell open circuit voltage data from the plug-in charge event with calculated voltage data from the reduced-order physics-based model includes using the equation:

$$V_{oc}=U_p(\text{soc}_p)-U_n(\theta_{n0\%}+\beta_p(\theta_{n100\%}-\theta_{n0\%}))$$

where $V_{oc}$ is the full-cell open circuit voltage from the plug-in charge event, $U_p$ is the cathode half-cell open circuit voltage, $\beta_p$ is a translation for the cathode's chemistry to the anode's chemistry, $U_n$ is the anode half-cell open circuit voltage, $\theta_{n0\%}$ is the minimum normalized solid concentration at the anode, and $\theta_{n100\%}$ is the maximum normalized solid concentration at the anode.

5. The method of claim 1 further comprising calculating an updated capacity for the cell based on the cathode half-cell stoichiometry, the anode half-cell stoichiometry and the current data.

6. The method of claim 5 wherein the updated SOC-OCV curve and capacity are used to optimize subsequent charging and discharging of the battery pack.

7. The method of claim 5 wherein the updated SOC-OCV curve and capacity are used to recommend replacement of the battery pack.

8. The method of claim 1 wherein calculating cathode half-cell stoichiometry includes using a state-based system calculation to determine cathode half-cell solid concentrations.

9. The method of claim 8 wherein the cathode half-cell solid concentrations are used to determine a cathode half-cell state of charge, and the cathode half-cell state of charge is used to determine a cathode half-cell open circuit voltage.

10. The method of claim 1 wherein the battery pack is used in an electric vehicle.

11. A method for monitoring performance changes in aging cells in a battery pack, said method comprising:
    detecting a plug-in charge event for the battery pack;
    determining if the battery pack has experienced a number of charge-discharge cycles exceeding a first threshold, so as to warrant calculating updated performance parameters;
    providing full-cell open circuit voltage data vs. time and current data vs. time for a cell in the battery pack, where the data is obtained by sensors during the plug-in charge event;
    determining, using the open circuit voltage data, if the plug-in charge event produced an increase in battery pack state of charge exceeding a second threshold, so as to enable calculation of the updated performance parameters;
    running a reduced-order physics-based model on a microprocessor to calculate updated stoichiometry values for the cell, using the open circuit voltage data and the current data; and
    using the updated stoichiometry values to calculate an updated state of charge vs. open circuit voltage curve and an updated capacity for the cell.

12. The method of claim 11 wherein running a reduced-order physics-based model includes calculating cathode half-cell stoichiometry using the current data, providing cathode concentration data vs. time and cathode half-cell open circuit voltage data vs. time, and determining anode half-cell stoichiometry using the cathode concentration data, the cathode half-cell open circuit voltage data and the full-cell open circuit voltage data.

13. The method of claim 12 wherein calculating cathode half-cell stoichiometry includes using a state-based system calculation to determine cathode half-cell solid concentrations.

14. The method of claim 12 wherein determining anode half-cell stoichiometry includes determining anode half-cell open circuit voltage based on estimated values for maximum and minimum normalized solid concentration at the anode.

15. The method of claim 14 wherein parameter regression/optimization is performed on the maximum and minimum normalized solid concentration values to achieve minimization of an error function comparing the full-cell open circuit voltage data from the plug-in charge event with calculated voltage data from the reduced-order physics-based model.

16. A system for monitoring performance changes in aging cells in a battery pack, said system comprising:
    a battery state estimator for providing full-cell open circuit voltage data and current data for one or more cells in the battery pack from a plug-in charge event; and
    a computation module which receives the voltage and current data from the battery state estimator and includes a microprocessor configured to run a reduced-order physics-based model which determines updated stoichiometry values for an anode half-cell and uses the stoichiometry values to compute an updated state of charge vs. open circuit voltage curve (SOC-OCV curve) and capacity for the one or more cells in the battery pack.

17. The system of claim 16 wherein the reduced-order physics-based model includes a calculation of cathode half-cell stoichiometry using the current data, provides cathode concentration data vs. time and cathode half-cell open circuit voltage data vs. time, and determines anode half-cell stoichiometry using the cathode concentration data, the cathode half-cell open circuit voltage data and the full-cell open circuit voltage data.

18. The system of claim 17 wherein the calculation of cathode half-cell stoichiometry includes using a state-based system calculation to determine cathode half-cell solid concentrations.

19. The system of claim 17 wherein the determination of anode half-cell stoichiometry includes a determination of anode half-cell open circuit voltage based on estimated values for maximum and minimum normalized solid stoichiometric concentration at the anode.

20. The system of claim 19 wherein parameter regression/optimization is performed on the maximum and minimum normalized solid stoichiometric concentration values to achieve minimization of an error function comparing the full-cell open circuit voltage data from the plug-in charge event with calculated voltage data from the reduced-order physics-based model.

* * * * *